United States Patent [19]

Hogeboom

[11] Patent Number: 4,465,983

[45] Date of Patent: Aug. 14, 1984

[54] CMOS OSCILLATOR HAVING POSITIVE FEEDBACK CAPACITOR CHARGED AND DISCHARGED WITH CONSTANT CURRENTS

[75] Inventor: John G. Hogeboom, Nepean, Canada

[73] Assignee: Northern Telecom Limited, Montreal, Canada

[21] Appl. No.: 423,608

[22] Filed: Sep. 27, 1982

[51] Int. Cl.³ .................... H03K 3/03; H03K 3/353
[52] U.S. Cl. .................................. 331/111; 331/143; 331/177 R; 331/DIG. 3
[58] Field of Search ............. 331/111, 143, 177 R, 331/DIG. 3, 57, 108 D; 330/277; 307/450

[56] References Cited

U.S. PATENT DOCUMENTS 3,723,907  3/1973  Tajchman et al. ............. 331/111 X
3,973,222  8/1976  Kucharewski ............. 331/108 D X
4,151,473  4/1979  Coleman et al. .................... 328/134
4,316,158  2/1982  Akita et al. ............... 331/DIG. 3 X Primary Examiner—Siegfried H. Grimm
Assistant Examiner—Robert Pascal
Attorney, Agent, or Firm—R. John Haley

[57] ABSTRACT

An oscillator including an amplifier which is formed by CMOS inverters and has a positive feedback path from an output to an input of the amplifier. The positive feedback path includes a capacitor which is alternately charged and discharged by switched constant current devices controlled by the amplifier and connected to the amplifier input. The amplifier includes a second capacitor in a negative feedback path to limit voltage swings at the amplifier input. The constant charging and discharging currents can be produced by current mirrors which are controlled to control the oscillation frequency.

7 Claims, 1 Drawing Figure

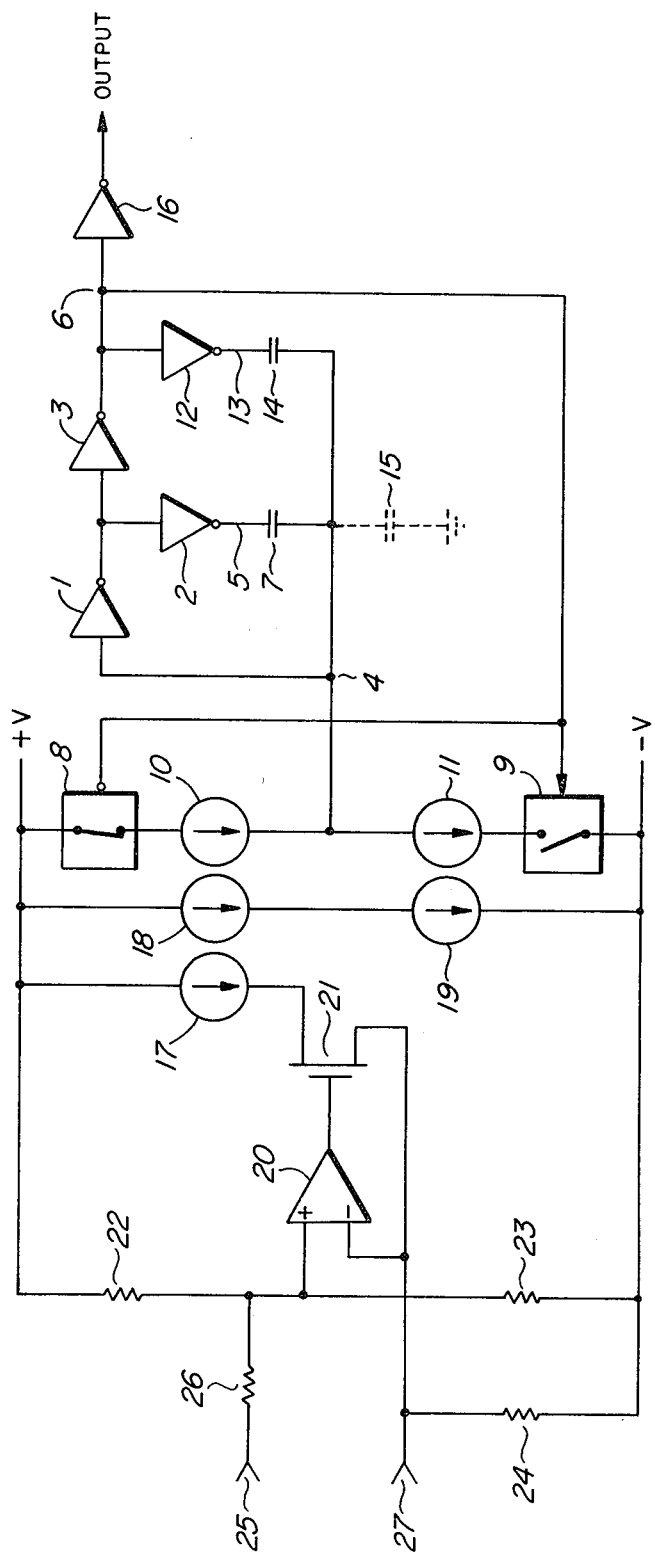

CMOS OSCILLATOR HAVING POSITIVE FEEDBACK CAPACITOR CHARGED AND DISCHARGED WITH CONSTANT CURRENTS

This invention relates to CMOS (complementary metal oxide semiconductor) oscillators.

It is desirable to provide a CMOS oscillator in the form of an integrated circuit, having a frequency which is determined by a component which is external to the integrated circuit. Furthermore, it is desirable for the oscillation frequency to be controllable so that the oscillator may be used in a phase locked loop.

Accordingly, an object of this invention is to provide an improved CMOS oscillator.

According to this invention there is provided an oscillator comprising CMOS amplifying means having an input and first and second outputs, the first output being in phase with the input; a first capacitor coupled between the first output and the input; and two switched constant current means coupled to the input and controlled by the second output for alternately charging and discharging the capacitor.

In order to limit voltage swings at the input of the amplifying means, the amplifying means preferably has a third output, which is out of phase with the input, the oscillator comprising a second capacitor coupled between the third output and the input, the second capacitor having a smaller capacitance than the first capacitor.

The invention will be further understood from the following description with reference to the drawing, which schematically illustrates an oscillator in accordance with an embodiment of the invention.

The oscillator primarily comprises three CMOS inverters 1, 2, and 3 which form a CMOS amplifier having an input 4 and outputs 5 and 6 which are in phase with the input. The inverter 1 has its input connected to the input 4, and the inverters 2 and 3 have their inputs connected to the output of the inverter 1 and their outputs constitute the outputs 5 and 6 respectively. A first capacitor 7 is connected between the output 5 and the input 4. The output 6 controls two complementary switches 8 and 9 to be open and closed alternately, thereby alternately to supply a constant current to the input 4 via a constant current device 10 and to sink the same constant current from the input 4 via a constant current device 11, thereby alternately to charge and discharge the capacitor 7.

As so far described, the oscillator produces a trapezoidal waveform at the input 4, the voltage at the input 4 successively falling rapidly from zero to $-2$ V when the inverters change state, then rising linearly to zero as current is supplied via the device 10, then rising rapidly to $+2$ V when the inverters change state, and then falling linearly to zero as current to sunk via the device 11, assuming that the inverters have supply voltages of $+V$ and $-V$ and change state on each input zero crossing.

In order to limit the $+2$ V and $-2$ V voltage swings at the input 4 to $+V$ and $-V$, as is desirable in view of the characteristics of the constant current devices 10 and 11, the output of the inverter 3 is coupled via a further inverter 12 to a third output 13 of the amplifier, and a second capacitor 14 is connected between this output 13 and the input 4. The capacitor 14, and any stray capacitance between the input 4 and ground potential represented by a capacitor 15 shown in broken lines in the drawing, serve to partially counteract the effects of the capacitor 7. The limited input voltage swings of $+V$ and $-V$ are achieved when $C1 = CS + 3C2$, where C1, CS, and C2 are the capacitances of the capacitors 7, 15, and 14 respectively.

As illustrated, a final output of the oscillator is derived by inversion of the second output 6 of the amplifier in an inverter 16.

The constant current devices 10 and 11 are constituted by current mirror circuits of known form. In order to establish the same current through each of these circuits, other current mirror circuits 17, 18, and 19 are provided. A current established through the circuit 17 as described below is mirrored in the circuit 18, and this same current flows through the circuit 19 connected in series with the circuit 18. The currents through the circuits 18 and 19 are mirrored in the circuits 10 and 11 respectively when the switches 8 and 10 respectively are closed.

The current through the circuit 17 is determined by a circuit comprising a differential amplifier 20, a MOS transistor 21, a potential divider comprising equal magnitude resistors 22 and 23, and a further resistor 24 of resistance R. The circuit 17, controlled path of the transistor 21, and the resistor 24 are connected in series between the supply voltages $+V$ and $-V$, as are the resistors forming the potential divider. The amplifier 20 has its non-inverting input connected to the junction between the resistors 22 and 23, its inverting input connected to the junction between the transistor 21 and the resistor 24, and its output connected to the control electrode of the transistor 21. A current V/R thus flows through the resistor 24 and hence through the circuit 17, and the oscillator has an oscillation frequency of $\frac{1}{4}RC$, where $C = C1 + C2 + CS$.

The oscillation frequency can be modified by varying the normally zero voltage at the non-inverting input of the amplifier 20 by applying a control voltage to an input 25 which is coupled to this non-inverting input via a resistor 26, and/or by supplying current to or sinking current from an input 27 which is coupled to the inverting input of the amplifier 20. Thus either of these inputs can be used to control the oscillation frequency, facilitating use of the oscillator in, for example, a phase locked loop. In such an arrangement, all of the circuitry except the resistor 24, which is desirably an external stable component which determines the nominal oscillation frequency, can be formed in a single integrated circuit device.

Although a particular embodiment of the invention has been described, numerous modifications, variations, and adaptations may be made thereto without departing from the scope of the invention as claimed. In particular it is observed that the current mirror circuits and switches described above may be replaced by other types of switched constant current means, such as gated current sources and sinks similar to those described in Coleman et al U.S. Pat. No. 4,151,473 dated Apr. 24, 1979.

What is claimed is:

1. An oscillator comprising CMOS amplifying means having an input and first and second outputs, the first output being in phase with the input; a first capacitor coupled between the first output and the input; and two switched constant current means coupled to the input and controlled by the second output for alternately charging and discharging the capacitor.

2. An oscillator as claimed in claim 1 wherein the CMOS amplifying means comprises a first inverter having an input constituting the input of the amplifying means, and second and third inverters each having an input connected to the output of the first inverter and an output constituting respectively the first and second outputs of the amplifying means.

3. An oscillator as claimed in claim 1 or 2 wherein the amplifying means has a third output, which is out of phase with the input, and comprising a second capacitor coupled between the third output and the input, the second capacitor having a smaller capacitance than the first capacitor.

4. An oscillator as claimed in claim 1 wherein the two switched constant current means both conduct substantially the same constant current.

5. An oscillator as claimed in claim 4 wherein the two switched constant current means comprise a plurality of current mirror circuits, means for determining a constant current conducted through each current mirror circuit, and switching means controlled by the second output for alternately connecting each of two of the plurality of current mirror circuits to the input of the amplifying means for alternately supplying the constant current to and sinking the constant current from the input thereby alternately to charge and discharge the first capacitor.

6. An oscillator as claimed in claim 5 wherein the means for determining the constant current comprises a differential amplifier having a non-inverting input coupled to a reference potential and an inverting input coupled via a resistor to a supply potential, and a transistor controlled by the output of the differential amplifier and having a controlled path connected in series between a further one of the plurality of current mirror circuits and the junction between the resistor and the inverting input of the differential amplifier.

7. An oscillator as claimed in claim 6 and including means for modifying the voltage at one of the inputs of the differential amplifier to control the oscillation frequency of the oscillator.

* * * * *